(12) United States Patent
Konchady et al.

(10) Patent No.: US 8,907,461 B1
(45) Date of Patent: Dec. 9, 2014

(54) HEAT DISSIPATION DEVICE EMBEDDED WITHIN A MICROELECTRONIC DIE

(71) Applicants: Manohar S. Konchady, Chandler, AZ (US); Mihir K. Roy, Chandler, AZ (US)

(72) Inventors: Manohar S. Konchady, Chandler, AZ (US); Mihir K. Roy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/904,169

(22) Filed: May 29, 2013

(51) Int. Cl.
*H01L 23/495* (2006.01)
*H01L 23/10* (2006.01)
*H01L 23/34* (2006.01)
*H01L 21/44* (2006.01)
*H01L 21/48* (2006.01)

(52) U.S. Cl.
CPC ...................................... *H01L 23/34* (2013.01)
USPC ........... 257/675; 257/706; 257/712; 257/720; 438/106; 438/122

(58) Field of Classification Search
CPC . H01L 21/4871; H01L 21/4882; H01L 23/34; H01L 23/36; H01L 23/367

USPC ............ 438/15, 106, 122; 257/675, 706, 712, 257/720; 165/80.2, 104.33
See application file for complete search history.

(56) References Cited

U.S. PATENT DOCUMENTS

| | | | |
|---|---|---|---|
| 7,029,951 B2 * | 4/2006 | Chen et al. ..................... | 438/122 |
| 7,122,891 B2 * | 10/2006 | Dishongh et al. ............. | 257/700 |
| 7,286,359 B2 * | 10/2007 | Khbeis et al. ................. | 361/704 |
| 7,996,989 B2 * | 8/2011 | Dani et al. .................... | 29/890.03 |
| 8,275,755 B2 * | 9/2012 | Hirsch et al. .................. | 707/687 |
| 2005/0257821 A1 * | 11/2005 | Ramanathan et al. ........ | 136/203 |
| 2010/0127388 A1 * | 5/2010 | Stanley et al. ................ | 257/712 |
| 2012/0092834 A1 * | 4/2012 | Tain et al. ..................... | 361/717 |
| 2012/0161190 A1 * | 6/2012 | Yao ................................ | 257/99 |

* cited by examiner

*Primary Examiner* — Hsien Ming Lee
(74) *Attorney, Agent, or Firm* — Winkle, PLLC

(57) ABSTRACT

The subject matter of the present application relates to a heat dissipation device that is embedded within a microelectronic die. The heat dissipation device may be fabricated by forming at least one trench extending into the microelectronic die from a microelectronic die back surface, which opposes an active surface thereof, and filling the trenches with at least one layer of thermally conductive material. In one embodiment, the heat dissipation device may be a thermoelectric cooling device.

17 Claims, 8 Drawing Sheets

HEAT DISSIPATION DEVICE EMBEDDED WITHIN A MICROELECTRONIC DIE

TECHNICAL FIELD

Embodiments of the present description generally relate to the field of heat dissipation from a microelectronic die, and, more specifically, to a heat dissipation device embedded within the microelectronic die.

BACKGROUND ART

The microelectronic industry is continually striving to produce ever faster and smaller microelectronic dice for use in various mobile electronic products, such as portable computers, electronic tablets, cellular phones, digital cameras, and the like. As these goals are achieved, the density of power consumption of integrated circuit components within the microelectronic dice has increased, which, in turn, increases the average junction temperature of the microelectronic die. If the temperature of the microelectronic die becomes too high, the integrated circuits within the microelectronic die may be damaged or destroyed. In typical microelectronic dice, such as flip-chip type dice, heat is generally removed convectively with a heat spreader/heat sink attached to a back surface of the microelectronic die. However, when microelectronic dice are used in thin products, such as smart phones, tablets, ultrabook computers, and the like, space for the incorporation of such heat removal solutions is limited. Therefore, there is an ongoing effort to design ever more efficient, cost-effective, and lower profile heat dissipation devices for microelectronic dice.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
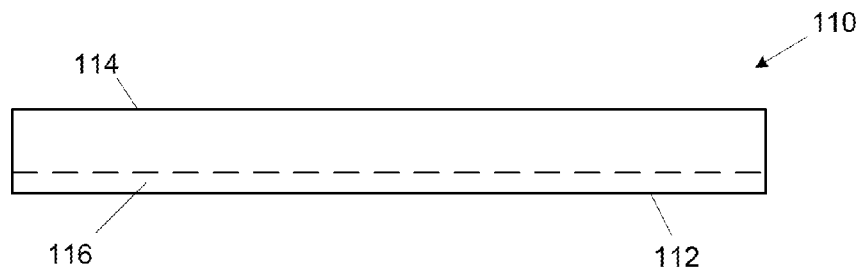
FIG. 1 illustrates a side cross-sectional view of a microelectronic die, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to a heat dissipation device that is embedded within a microelectronic die. The heat dissipation device may be fabricated by forming at least one trench extending into the microelectronic die from a microelectronic die back surface, which opposes an active surface thereof, and filling the trenches with at least one layer of thermally conductive material.

As shown in FIG. 1, a microelectronic die 110 may be fabricated or provided, wherein the microelectronic die 110 may include an active surface 112 and an opposing back surface 114. As will be understood to those skilled in the art, the microelectronic die 110 may include an active region 116 proximate the microelectronic die active surface 112, wherein the integrated circuitry (not shown) of the microelectronic die 110 is formed in and/or on the microelectronic die active region 116. The microelectronic die 110 may be formed from any appropriate material, including, but not limited to silicon, germanium, silicon-germanium or III-V compound semiconductor material, and may include a silicon-on-insulator substrate. The microelectronic die 110 may be any appropriate microelectronic device, including, but not limited to a microprocessor, a chipset, a graphics device, a wireless device, a memory device, an application specific integrated circuit device, and the like.

Figure 2A:
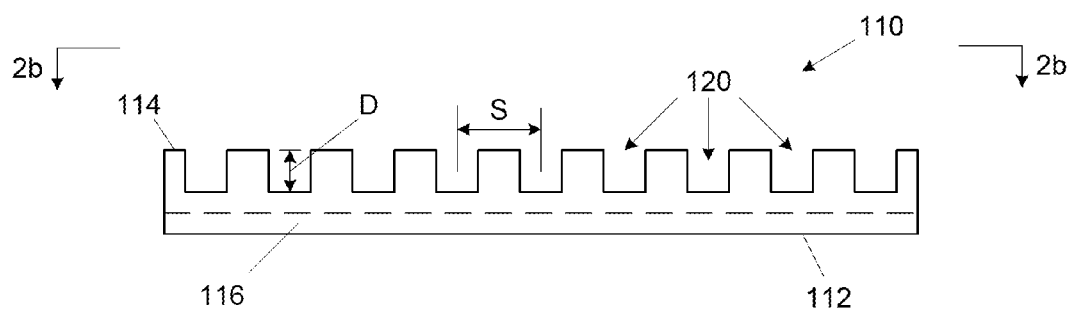
FIGS. 2a and 2b illustrate a side cross-sectional view and a top plan view, respectively, of at least one trench formed in a back surface of the microelectronic die of FIG. 1, according to one embodiment of the present description.
Figure 2B:
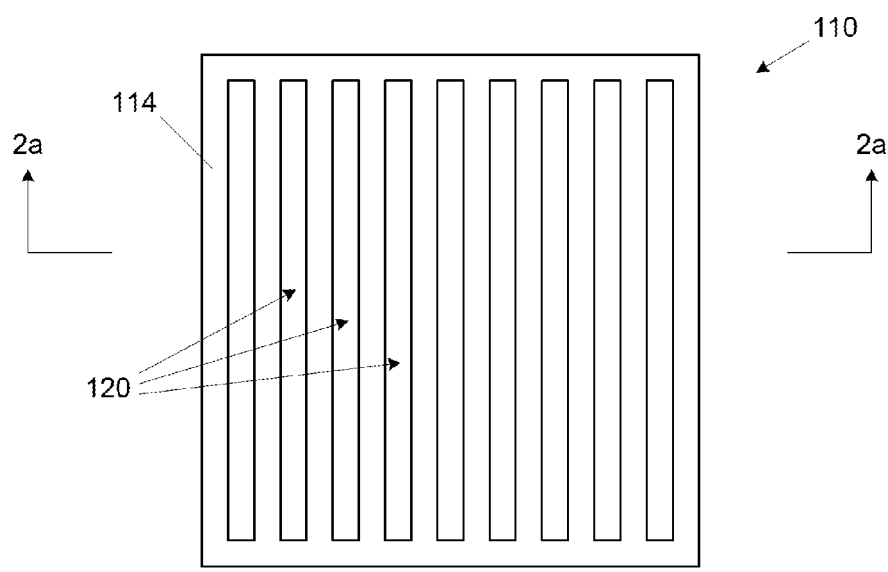
Figure 3A:
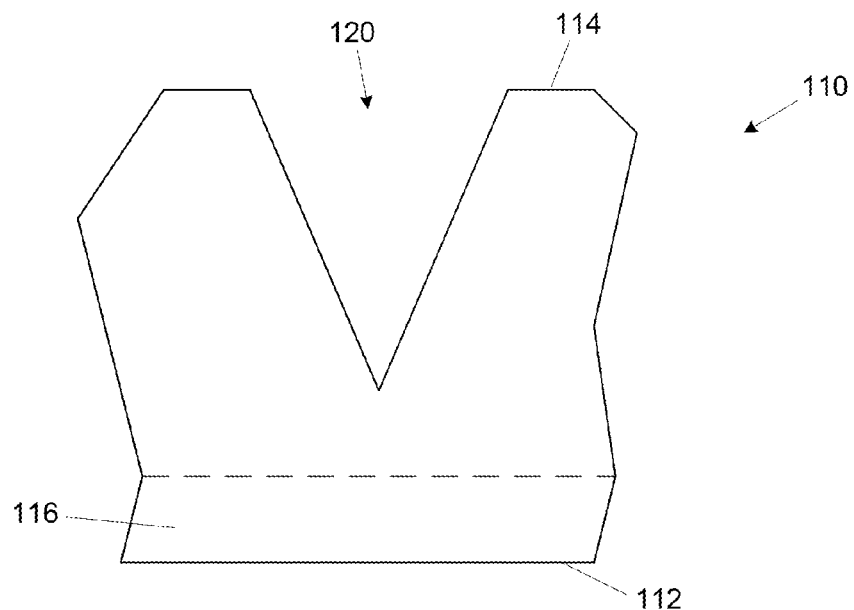
FIGS. 3a-3d illustrate side cross-sectional views of various embodiments of trench shapes, according to embodiments of the present description.
Figure 3B:
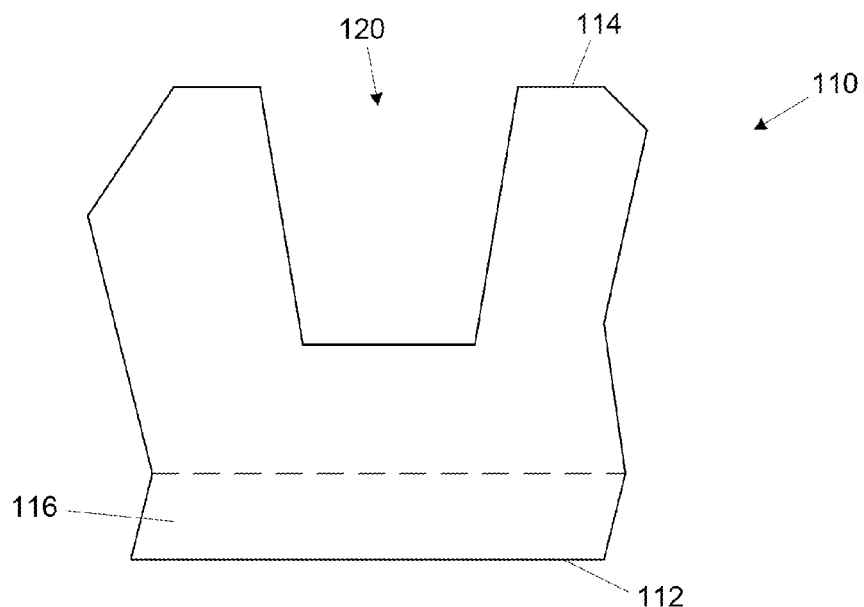
Figure 3C:
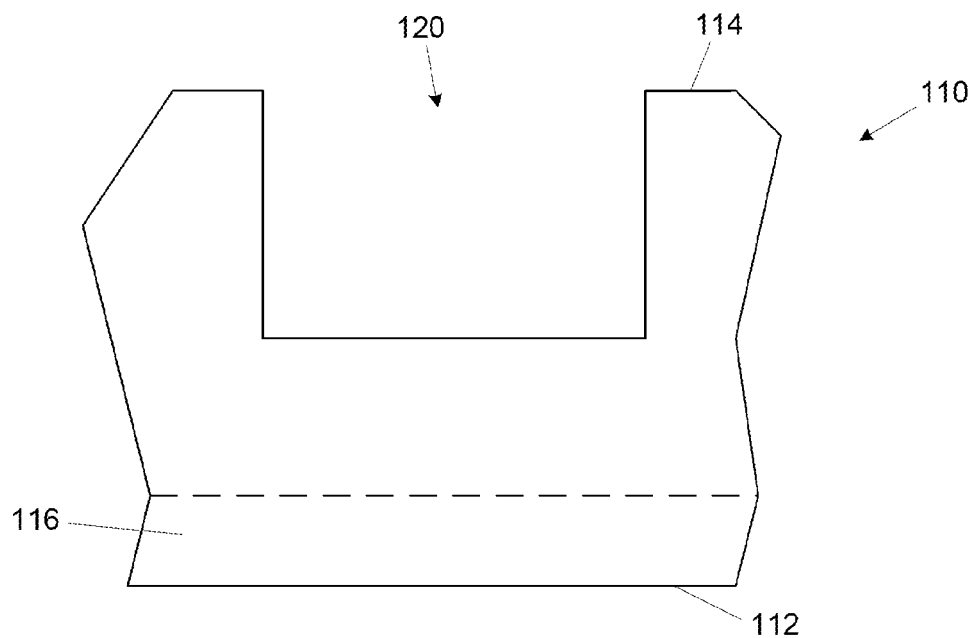
Figure 3D:
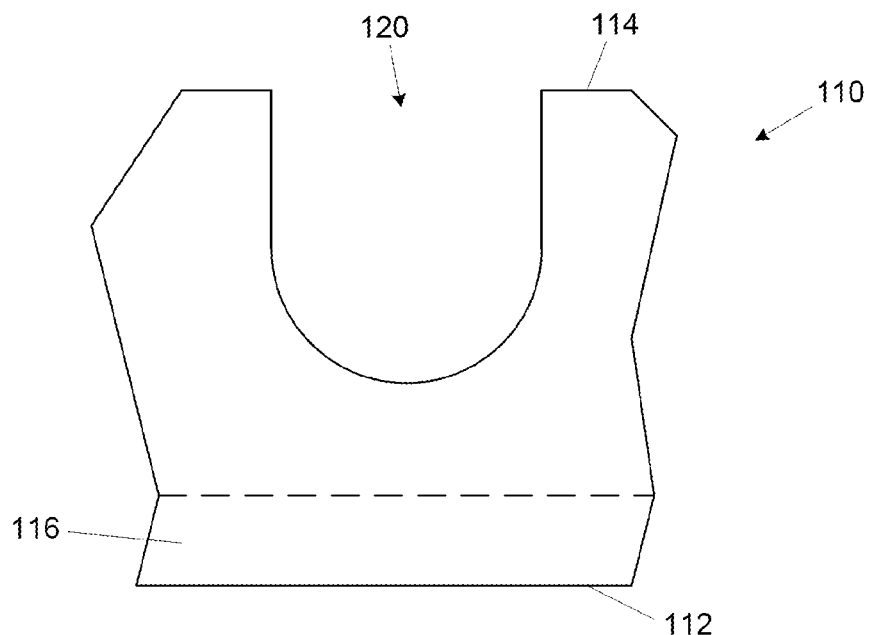

As shown in FIGS. 2a and 2b, at least one trench 120 may be formed to extend into the microelectronic die 110 from the microelectronic die back surface 114. The trenches 120 may be formed by any technique known in the art, including, but not limited to, lithography with wet or dry etching, ion bombardment, laser ablation, and the like. Although the trenches 120 of FIGS. 2a and 2b are illustrated to run substantially parallel to one another, it is understood that the trenches 120 could form any appropriate pattern. Furthermore, although the trenches 120 are shown in FIG. 2 as having a substantially square shaped in cross-section, it is understood that the trenches 120 may have any appropriate cross-sectional shape including V-shaped (FIG. 3a), trapezoidal (FIG. 3b), rectangular (FIG. 3c), U-shaped (FIG. 3d), and the like. As will be understood to those skilled in the art, the cross-sectional shape of the trenches 120 may be a function of the technique used to form the trenches 120, as well as the operating parameters used with those techniques.

Figure 4:
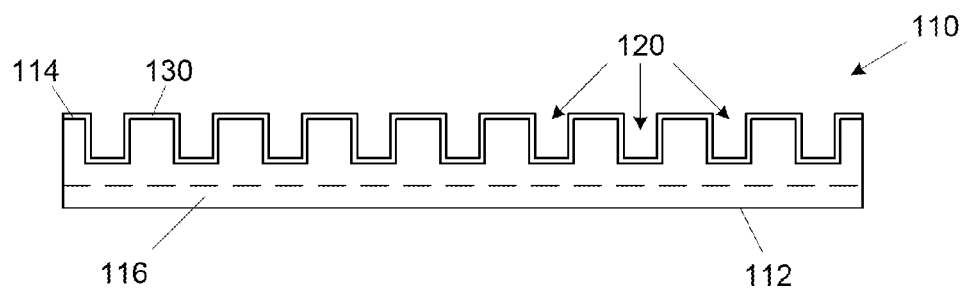
FIG. 4 illustrates a side cross-sectional view of a seed/barrier layer deposited on the microelectronic die back surface and within the trenches of the structure illustrated in FIG. 2, according to an embodiment of the present description.

As shown in FIG. 4, at least one seed and/or a barrier layer 130 may be optionally deposited on the microelectronic die back surface 114 and within the trenches 120. The seed/barrier layer 130 may be formed from any appropriate material and may be deposited by any technique known in the art, including but not limited to, sputtering processes and electroless plating processes. As will be understood to those skilled in the art, a barrier layer may be utilized to prevent migration of a subsequently deposited material, and a seed layer may be utilized assist in the subsequent plating of a material.

Figure 5:
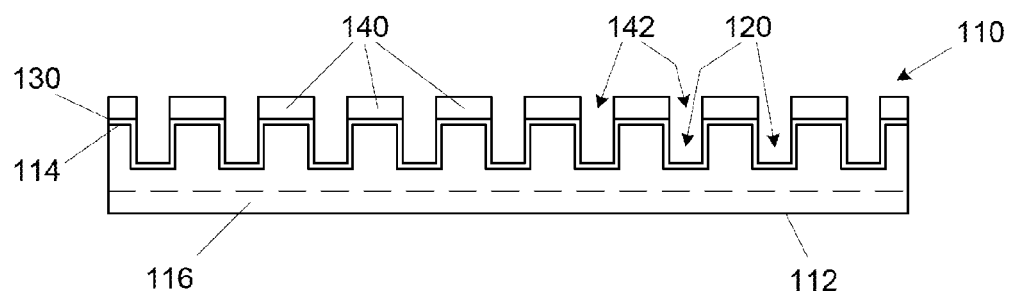
FIG. 5 illustrates a side cross-sectional view of a mask patterned on the microelectronic die back surface with at least one opening corresponding to at least one of the trenches of the structure illustrated in FIG. 4, according to an embodiment of the present description.

As shown in FIG. 5, a mask 140 may be patterned on the microelectronic die back surface 114 with at least one opening 142 corresponding to at least one of the trenches 120. The mask 140 may be any appropriate material, including but not limited to photoresist materials, such as poly(methyl methacrylate), poly(methyl glutarimide), phenol formaldehyde resin, and the like, and may be patterned by any known technique, including but not limited to, lithographic techniques.

Figure 6:
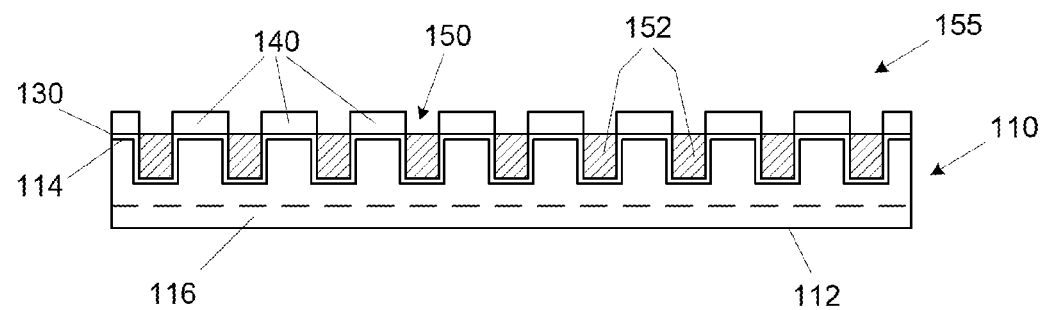
FIG. 6 illustrates a side cross-sectional view of the trenches of FIG. 5 filled with a thermally conductive material to form at least one heat transfer device, according to an embodiment of the present description.
Figure 7:
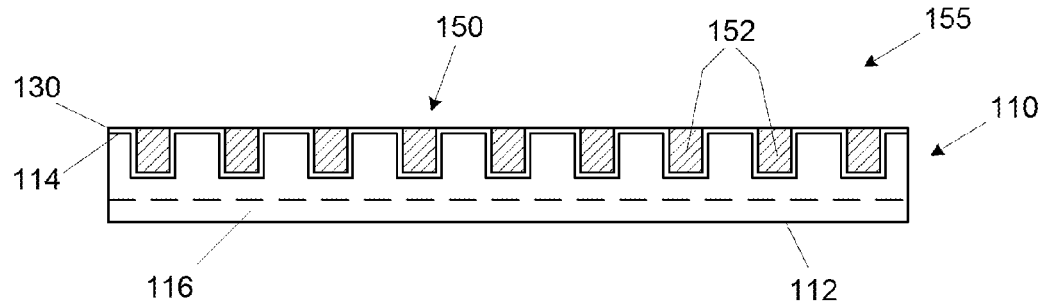
FIG. 7 illustrates a side cross-sectional view of the structure of FIG. 6 after the removal of the mask, according to an embodiment of the present description.

As shown in FIG. 6, the trenches 120 (see FIG. 5) may be filled with an appropriate thermally conductive material 152 to form at least one heat dissipation device 150, and thereby forming a microelectronic device 155 comprising the microelectronic die 110 and the heat dissipation device 150. The filling of the trenches 120 (see FIG. 5) may be achieved by any technique known in the art, including but not limited to electrolytic plating. The thermally conductive material 152 may be any appropriate material including but not limited to metals, such as copper, silver, alloys thereof, and the like. As shown in FIG. 7, the mask 140 (see FIG. 6) may be removed by any appropriate technique known in the art. It is understood that after the removal of the mask 140 (see FIG. 6), the microelectronic die back surface 114 and/or the thermally conductive material 152 may be planarized.

As will be understood to those skilled in the art, the formation of the heat dissipation device 150 may increase the cross-section contact area for heat transfer, thereby enhancing the removal of heat from the microelectronic die 110, without substantially changing a thickness T (see FIG. 2a), of the microelectronic die 110. It is understood, that trench depth D (see FIG. 2a), trench spacing S (see FIG. 2a), and the cross-sectional shape of the trenches 120 (e.g. see FIGS. 2a and 3a-3d) may be varied depending on thermal performance requirements. It is further understood that the trench depth D should not encroach into the active region 116 (e.g. such that no transition performance would be detected). Additionally, it is understood that the thermally conductive material 152 (see FIG. 7) could be selected to have a coefficient of thermal expansion that substantially counteracts warpage during subsequent reflow processes, as will be understood to those skilled in the art.

Figure 8A:
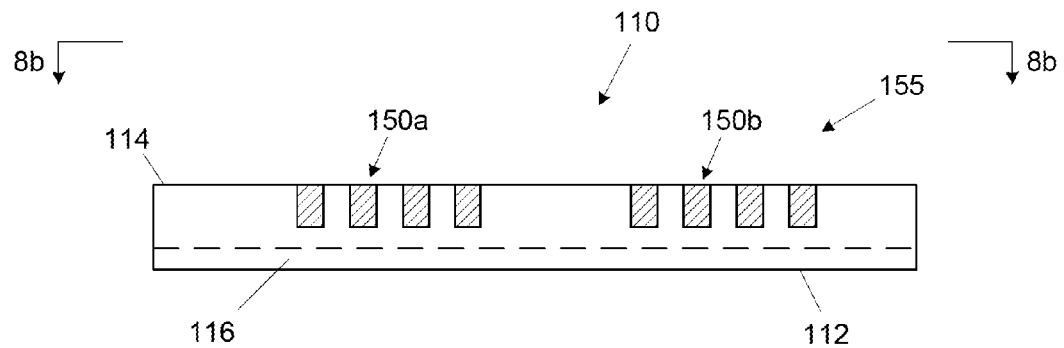
FIGS. 8a and 8b illustrates a side cross-sectional view and a top plan view, respectively, of a microelectronic die having embedded heat dissipation devices located in specific regions of the microelectronic die, according to another embodiment of the present description.
Figure 8B:
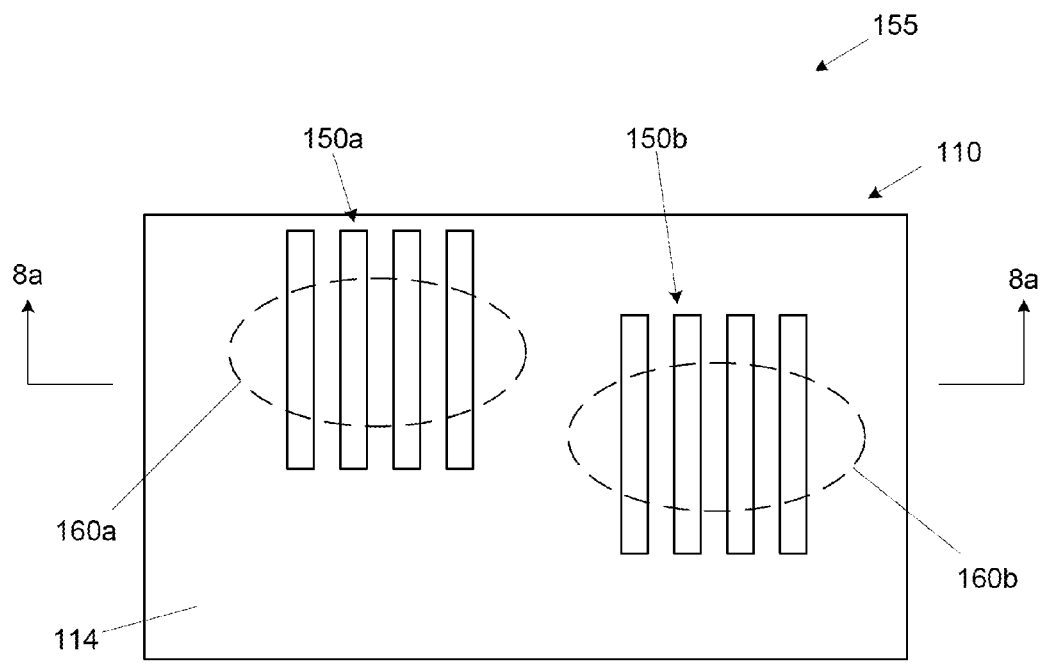

Although the heat dissipation device 150 is shown to extend substantially across the entire microelectronic die back surface 114 in FIG. 2b, one of more heat dissipation devices (shown as elements 150a and 150b in FIGS. 8a and 8b) may be selectively formed over "hot spot regions" (shown as elements 160a and 160b in FIGS. 8a and 8b). Hot spot regions 160a and 160b are areas wherein the greatest amount of heat is generated by the integrated circuitry (not shown) within the microelectronic die 110. The selective formation of the heat dissipation devices 150a and 150b may be advantageous in reducing the cost of fabrication depending on the thermal requirements of the microelectronic die 110, as will be understood to those skilled in the art.

Figure 9A:
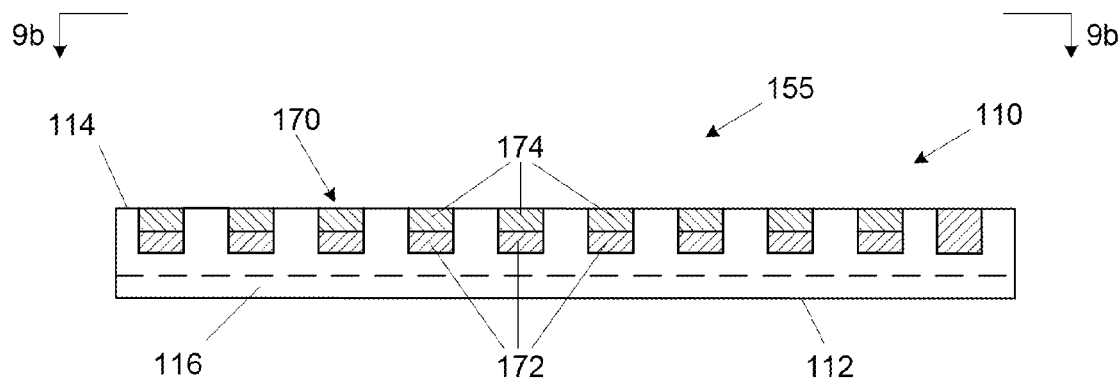
FIGS. 9a and 9b illustrates a side cross-sectional view and a top plan view, respectively, of a microelectronic die having an embedded thermoelectric cooling device, according to yet another embodiment of the present description.
Figure 9B:
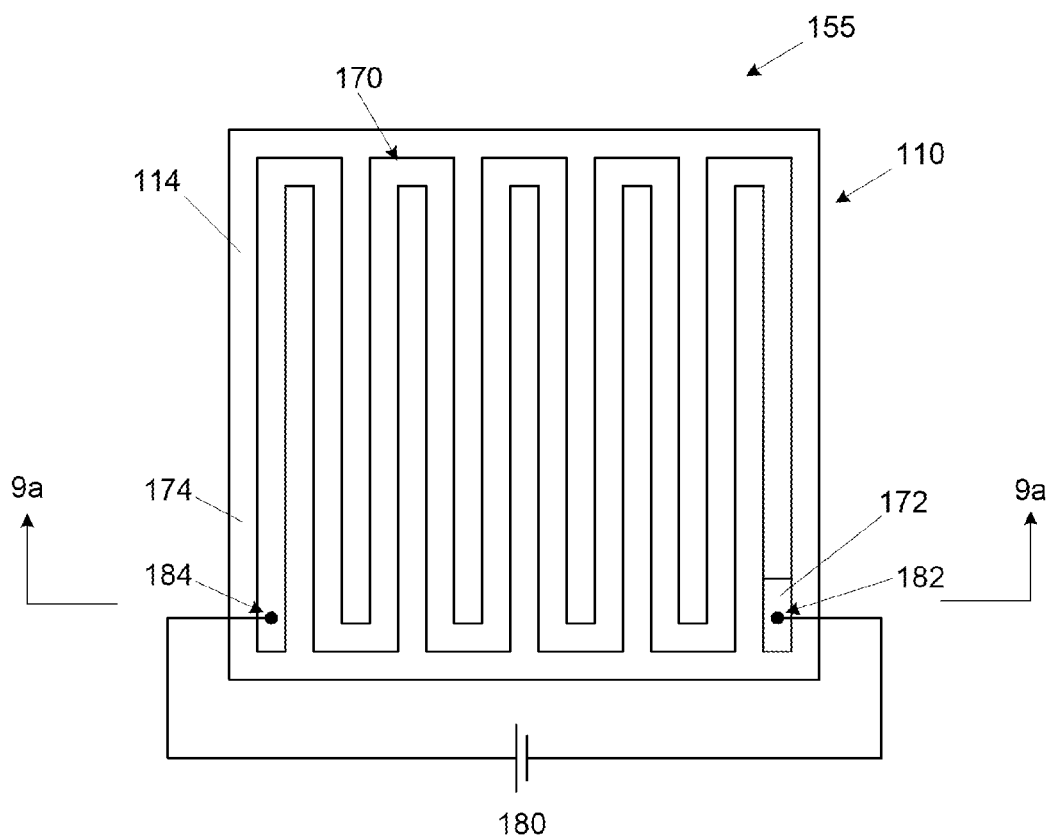

In another embodiment of the present description, as shown in FIGS. 9a and 9b, the heat dissipation device may be a thermoelectric heat dissipation device (i.e., a Peltier effect device). A thermoelectric heat dissipation device is a solid-state electric heat pump which utilizes electric current to induce a Peltier effect creating a heat flux between an interface between two different conductive materials, thereby transferring heat from one side of the thermoelectric heat dissipation device to the other side thereof. The thermoelectric heat dissipation device (illustrated as element 170) may comprise a first conductive material layer 172 and a second conductive material layer 174 abutting the first conductive material layer 172, both of which are disposed within a trench 120. The first conductive material layer 172 may be electrically connected to a first terminal 182 of a current generating electrical device 180 and the second conductive material layer 174 may be electrically connected to a second terminal 184 of the current generating electrical device 180. The trench 120, the first conductive material layer 172, and the second conductive material layer 174 may be formed by any known techniques including those discussed with regard to FIGS. 1-8b.

Figure 10:
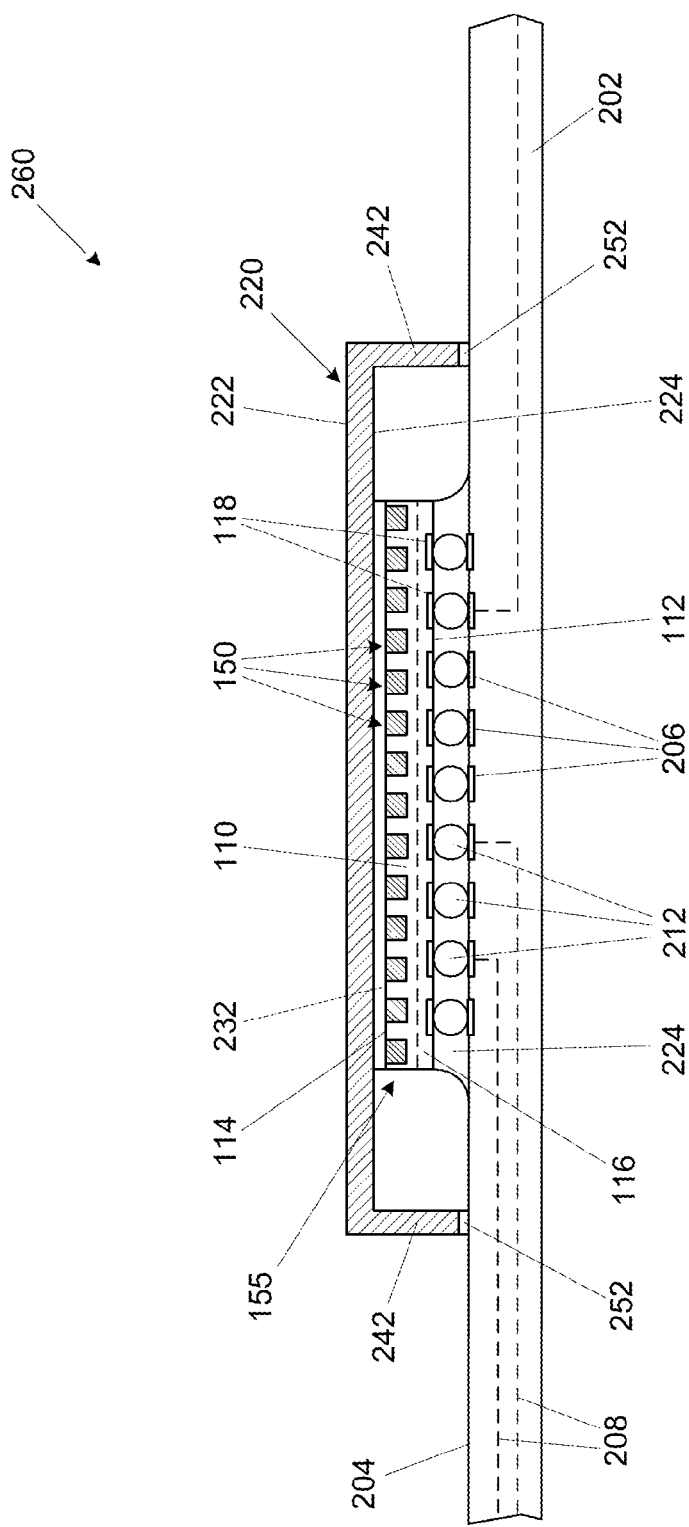
FIG. 10 illustrates a side cross-sectional view of a microelectronic die, having an embedded heat dissipation device, attached to a microelectronic structure and having an integrated heat spreading in thermal contract therewith, according to an embodiment of the present description.

As shown in FIG. 10, the microelectronic die 110 may be attached to a first surface 204 of the microelectronic substrate 202 with a plurality of interconnects 212. The die-to-substrate interconnects 212, such as soldered interconnects, may extend between bond pads 118 formed in or on the microelectronic die active surface 112 of the microelectronic die 110 and substantially mirror-image bond pads 206 in or on the microelectronic substrate first surface 204. An underfill material 224, such as an epoxy material, may be disposed between the microelectronic die active surface 112 and the microelectronic substrate first surface 204.

As further shown in FIG. 10, the microelectronic substrate 202 may provide electrical communication routes (illustrated as dashed lines 208) between the microelectronic die 110 and external components (not shown). As will be understood to those skilled in the art, the microelectronic die bond pads 118 are in electrical communication with integrated circuitry (not shown) within the microelectronic die 110.

As still further illustrated in FIG. 10, an integrated heat spreader 220 may be in thermal contact with the microelectronic die 110, to form a microelectronic system 260. The integrated heat spreader 220 may have a first surface 222 and an opposing second surface 224 in thermal contact with the heat dissipation device 150 embedded in the microelectronic die 110. A thermal interface material 232, such as a thermally conductive grease or polymer, may be disposed between the integrated heat spreader second surface 224 and the heat dissipation device 150 to facilitate heat transfer therebetween. The integrated heat spreader 220 may include at least one footing 242 extending between the integrated heat spreader second surface 224 and the microelectronic substrate 202, wherein the integrated heat spreader footing 242 may be attached to the microelectronic substrate first surface 204 with an adhesive material 252, such as an epoxy material. The integrated heat spreader 220 may be made of any appropriate thermally conductive material, such a metals and alloys, including, but not limited to, copper, aluminum, and the like. It is understood that the integrated heat spreader 220 may be utilized as a load mechanism.

Figure 11:
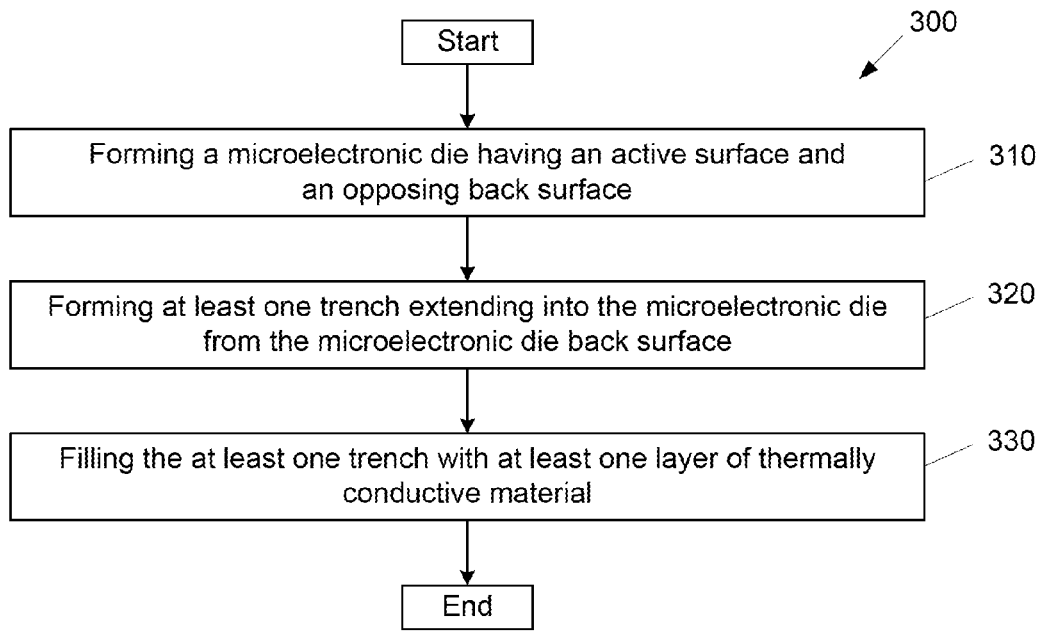
FIG. 11 is a flow chart of a process of forming a heat dissipation device within a microelectronic die, according to an embodiment of the present description.

FIG. 11 is a flow chart of a process 300 of fabricating a microelectronic structure according to the various embodiments of the present description. As set forth in block 310, a microelectronic die may be formed having an active surface and an opposing back surface. At least one trench may be formed extending into the microelectronic die from the microelectronic die back surface, as set forth in block 320. As set forth in block 330, the at least one trench may be filled with at least one layer of thermally conductive material.

Figure 12:
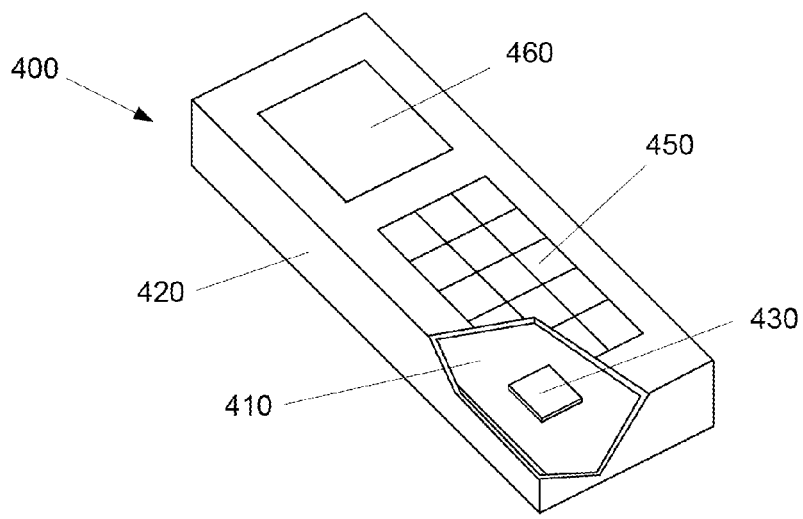
FIG. 12 illustrates an electronic system, according to one embodiment of the present description.

FIG. 12 illustrates an embodiment of an electronic system/device 400, such as a portable computer, a desktop computer, a mobile telephone, a digital camera, a digital music player, a web tablet/pad device, a personal digital assistant, a pager, an instant messaging device, or other devices. The electronic system/device 400 may be adapted to transmit and/or receive information wirelessly, such as through a wireless local area network (WLAN) system, a wireless personal area network (WPAN) system, and/or a cellular network. The electronic system/device 400 may include a microelectronic motherboard or substrate 410 disposed within a device housing 420. The microelectronic motherboard/substrate 410 may have various electronic components electrically coupled thereto, including a microelectronic device including a microelectronic die and a heat dissipation device disposed therein, as described in the present description (see FIGS. 1-10), and optionally the integrated heat spreader of FIG. 11, all of which are shown generically as element 430. The microelectronic motherboard 410 may be attached to various peripheral devices including an input device 450, such as keypad, and a display device 460, such an LCD display. It is understood that the display device 460 may also function as the input device, if the display device 460 is touch sensitive.

The following examples pertain to further embodiments, wherein Example 1 is a microelectronic device, comprising a microelectronic die having an active surface and an opposing back surface; and at least one heat dissipation device extending into the microelectronic die from the microelectronic die back surface.

In Example 2, the subject matter of Example 1 can optionally include the heat dissipation device comprising at least one layer of thermally conductive material within the at least one trench extending into the microelectronic die.

In Example 3, the subject matter of Example 2 can optionally include the at least one layer of thermally conductive material within the at least one trench comprises a first thermally conductive material layer abutting a second thermally conductive material layer.

In Example 4, the subject matter of Example 3 can optionally include the first thermally conductive material layer in electrical contact with a first terminal of a current generating electrical device and the second thermally conductive material layer in electrical contact with a second terminal of the current generating electronic device.

In Example 5, the subject matter of any of Examples 1 to 4 can optionally include the at least one heat dissipation device positioned proximate a hot spot location in the microelectronic die.

In Example 6, the subject matter of any of Examples 1 to 4 can optionally include the at least one heat dissipation device comprising a thermally conductive material selected from a group consisting of copper and silver.

In Example 7, the subject matter of any of Examples 1 to 4 can optionally include the microelectronic die active surface electrically connected to a microelectronic substrate.

In Example 8, the subject matter of any of Examples 1 to 4 can optionally include an integrated heat spreader in thermal contact with the at least one heat dissipation device.

In Example 9, the subject matter of any of Examples 1 to 4 can optionally include at least one of a seed layer and a barrier layer disposed between the microelectronic die and the at least one heat dissipation device.

The following examples pertain to further embodiments, wherein Example 10 is a method of fabricating a heat dissipation device within a microelectronic die, comprising forming a microelectronic die having an active surface and an opposing back surface; forming at least one trench extending into the microelectronic die from the microelectronic die back surface; and disposing at least one layer of thermally conductive material within the at least one trench.

In Example 11, the subject matter of Example 10 can optionally include the step of disposing at least one layer of thermally conductive material within the at least one trench comprising disposing a first thermally conductive material layer within the at least one trench and disposing a second thermally conductive material layer abutting the first thermally conductive material layer within the at least one trench.

In Example 12, the subject matter of Example 11 can optionally include the electrically contacting the first thermally conductive material layer with a first terminal of a current generating electrical device and electrically contacting the second thermally conductive material layer with a second terminal of the current generating electronic device.

In Example 13, the subject matter of Example 10 can optionally include forming at the least one trench extending into the microelectronic die from the microelectronic die back surface by a technique selected from the group consisting of etching, ion bombardment, and laser ablation.

In Example 14, the subject matter of any of Examples 10 to 13 can optionally include forming at least one of a seed layer and a barrier layer disposed between the at least one trench and the at least one thermally conductive material layer.

In Example 15, the subject matter of any of Examples 10 to 13 can optionally include the step of disposing at least one layer of thermally conductive material within the at least one trench comprising patterning a mask with at least one opening corresponding to the at least one trench; and plating the thermally conductive material within the at least one trench.

In Example 16, the subject matter of Example 15 can optionally include removing the mask.

In Example 17, the subject matter of any of Examples 10 to 13 can optionally include connecting the microelectronic die active surface to a microelectronic substrate.

In Example 18, the subject matter of any of Examples 10 to 13 can optionally include thermally contacting an integrated heat spreader with the heat dissipation device.

In Example 19, the subject matter of any of Examples 10 to 13 can optionally include disposing at least one layer of thermally conductive material selected from a group consisting of copper and silver.

In Example 20, the subject matter of any of Examples 10 to 13 can optionally include forming the at least one heat dissipation device proximate a hot spot location in the microelectronic die.

The following examples pertain to further embodiments, wherein Example 21 is an electronic system, comprising a housing; a microelectronic substrate disposed within the housing; and a microelectronic device comprising: a microelectronic die having an active surface and an opposing back surface electrically attached to the microelectronic surface by the microelectronic die first surface; and a heat dissipation device extending into the microelectronic die from the microelectronic die back surface.

In Example 22, the subject matter of Example 21 can optionally include the heat dissipation device comprising at least one layer of thermally conductive material within the at least one trench extending into the microelectronic die.

In Example 23, the subject matter of Example 22 can optionally include the at least one layer of thermally conductive material within the at least one trench comprising a first thermally conductive material layer abutting a second thermally conductive material layer.

In Example 24, the subject matter Examples 23 can optionally include the first thermally conductive material layer in electrical contact with a first terminal of a current generating electrical device and the second thermally conductive material layer in electrical contact with a second terminal of the current generating electronic device.

In Example 25, the subject matter of any of Examples 21 to 24 can optionally include the at least one heat dissipation device positioned proximate a hot spot location in the microelectronic die.

In Example 26, the subject matter of any of Examples 21 to 24 can optionally include the at least one heat dissipation device comprising a thermally conductive material selected from a group consisting of copper and silver.

In Example 27, the subject matter of any of Examples 21 to 24 can optionally include an integrated heat spreader in thermal contact with the at least one heat dissipation device.

In Example 28, the subject matter of any of Examples 21 to 24 can optionally include at least one of a seed layer and a barrier layer disposed between the microelectronic die and the at least one heat dissipation device.

It is understood that the subject matter of the present description is not necessarily limited to specific applications illustrated in FIGS. 1-12. The subject matter may be applied to other microelectronic device applications, as well as applications outside of the microelectronic industry, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic device, comprising:
a microelectronic die having an active surface and an opposing back surface; and
at least one heat dissipation device extending into, without extending through, the microelectronic die from the microelectronic die back surface, wherein heat dissipation device comprises a first thermally conductive material layer abutting a second thermally conductive material layer and wherein the first thermally conductive material layer is in electrical contact with a first terminal of a current generating electrical device and the second thermally conductive material layer is in electrical contact with a second terminal of the current generating electronic device.

2. The microelectronic device of claim 1, wherein the at least one heat dissipation device is positioned proximate a hot spot location in the microelectronic die.

3. The microelectronic device of claim 1, wherein the microelectronic die active surface is electrically connected to a microelectronic substrate.

4. The microelectronic device of claim 1, further comprising an integrated heat spreader in thermal contact with the at least one heat dissipation device.

5. The microelectronic device of claim 1, further comprising at least one of a seed layer and a barrier layer disposed between the microelectronic die and the at least one heat dissipation device.

6. A method of fabricating a heat dissipation device within a microelectronic die, comprising
forming a microelectronic die having an active surface and an opposing back surface;
forming at least one trench extending into, without extending through, the microelectronic die from the microelectronic die back surface;
disposing a first thermally conductive material within the at least one trench and disposing a second thermally conductive material layer abutting the first thermally conductive material layer within the at least one trench;
electrically contacting the first thermally conductive material layer with a first terminal of a current generating electrical device; and
electrically contacting the second thermally conductive material layer with a second terminal of the current generating electronic device.

7. The method of claim 6, wherein forming at least one trench extending into the microelectronic die from the microelectronic die back surface comprises forming at least one trench extending into the microelectronic die from the microelectronic die back surface by a technique selected from the group consisting of etching, ion bombardment, and laser ablation.

8. The method of claim 6, further comprising forming at least one of a seed layer and a barrier layer disposed between the at least one trench and the at least one thermally conductive material layer.

9. The method of claim 6, wherein disposing at least one layer of thermally conductive material within the at least one trench comprises patterning a mask with at least one opening corresponding to the at least one trench; and plating the thermally conductive material within the at least one trench.

10. The method of claim 9, further including removing the mask.

11. The method of claim 6, further comprising electrically connecting the microelectronic die active surface to a microelectronic substrate.

12. The method of claim 6, further including thermally contacting an integrated heat spreader with the heat dissipation device.

13. The method of claim 6, wherein forming the at least one heat dissipation device comprises forming the at least one heat dissipation device proximate a hot spot location in the microelectronic die.

14. An electronic system, comprising:
   a housing;
   a microelectronic substrate disposed within the housing; and
   a microelectronic device comprising:
      a microelectronic die having an active surface and an opposing back surface electrically attached to the microelectronic substrate by the microelectronic die active surface; and
      a heat dissipation device extending into, without extending through, the microelectronic die from the microelectronic die back surface, wherein the heat dissipation device comprises a first thermally conductive material layer abutting a second thermally conductive material layer and wherein the first thermally conductive material layer is in electrical contact with a first terminal of a current generating electrical device and the second thermally conductive material layer is in electrical contact with a second terminal of the current generating electronic device.

15. The electronic system of claim 14, wherein the at least one heat dissipation device is positioned proximate a hot spot location in the microelectronic die.

16. The electronic system of claim 14, further comprising an integrated heat spreader in thermal contact with the at least one heat dissipation device.

17. The electronic system of claim 14, further comprising at least one of a seed layer and a barrier layer disposed between the microelectronic die and the at least one heat dissipation device.

\* \* \* \* \*